United States Patent
Jain et al.

(10) Patent No.: US 11,183,973 B1
(45) Date of Patent: Nov. 23, 2021

(54) METHOD AND CIRCUIT FOR POWER CONSUMPTION REDUCTION IN ACTIVE PHASE SHIFTERS

(71) Applicant: Samsung Electronics Co., Ltd., Gyeonggi-do (KR)

(72) Inventors: Ajaypat Jain, San Jose, CA (US); Amitoj Singh, Sunnyvale, CA (US); Xiaohua Yu, San Jose, CA (US); Tienyu Chang, Sunnyvale, CA (US); Siu-Chuang Ivan Lu, San Jose, CA (US); Sang Won Son, Palo Alto, CA (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/989,421

(22) Filed: Aug. 10, 2020

Related U.S. Application Data

(60) Provisional application No. 63/033,488, filed on Jun. 2, 2020.

(51) Int. Cl.
*H03F 1/02* (2006.01)
*H03K 5/01* (2006.01)
(Continued)

(52) U.S. Cl.
CPC .......... *H03F 1/0205* (2013.01); *H03F 3/19* (2013.01); *H03K 5/01* (2013.01); *H03F 2200/336* (2013.01); *H03K 2005/00286* (2013.01)

(58) Field of Classification Search
None
See application file for complete search history.

(56) References Cited

U.S. PATENT DOCUMENTS

| | | | |
|---|---|---|---|
| 4,831,336 A | 5/1989 | Dautriche | |
| 4,994,773 A | 2/1991 | Chen et al. | |

(Continued)

FOREIGN PATENT DOCUMENTS

| | | |
|---|---|---|
| CN | 103986439 | 8/2014 |
| CN | 104767501 | 7/2015 |

(Continued)

OTHER PUBLICATIONS

D. Pepe et al., "Two mm-Wave Vector Modulator Active Phase Shifters With Novel IQ Generator in 28 nm FDSOI CMOS," in IEEE Journal of Solid-State Circuits, vol. 52, No. 2, ... pp. 344-356, Feb. 2017, doi: 10.1109/JSSC.2016.2605659.

(Continued)

*Primary Examiner* — Lincoln D Donovan
*Assistant Examiner* — Khareem E Almo
(74) *Attorney, Agent, or Firm* — The Farrell Law Firm, P.C.

(57) ABSTRACT

An electronic circuit and method are provided. The electronic circuit includes an in-phase (I)-quadrature (Q) amplifier including an I cascode branch and a Q cascode branch, the IQ amplifier configured to receive a differential input and control signals, control, based on the control signals, gate (Continued)

voltages in the I cascode branch and gate voltages in the Q cascode branch, generate an I output signal with the I cascode branch, and generate a Q output signal with the Q cascode branch, and a quadrature coupler configured to perform quadrature summation of the I output signal and the Q output signal and generate a final phase shifted output.

20 Claims, 4 Drawing Sheets

(51) Int. Cl.
*H03F 3/19* (2006.01)
*H03K 5/00* (2006.01)

(56) References Cited

U.S. PATENT DOCUMENTS

| | | | | |
|---|---|---|---|---|
| 5,939,917 | A * | 8/1999 | Debaty | H03H 11/20 327/246 |
| 5,945,860 | A * | 8/1999 | Guay | H03K 5/151 327/246 |
| 6,417,712 | B1 * | 7/2002 | Beards | H03C 3/40 327/231 |
| 6,831,497 | B2 * | 12/2004 | Koh | H03B 5/1228 327/254 |
| 7,068,104 | B2 * | 6/2006 | Burns | H03F 1/22 330/253 |
| 9,425,739 | B1 * | 8/2016 | Kramer | H03B 5/1215 |

FOREIGN PATENT DOCUMENTS

| | | |
|---|---|---|
| CN | 105207644 | 12/2015 |
| CN | 105915196 | 8/2016 |
| CN | 107124154 | 9/2017 |
| CN | 107707217 | 2/2018 |
| CN | 109546987 | 3/2019 |
| CN | 109585983 | 4/2019 |
| CN | 109802652 | 5/2019 |
| CN | 110212887 | 9/2019 |

OTHER PUBLICATIONS

H. J. Qian et al., "High-Resolution Wideband Phase Shifter With Current Limited Vector-Sum," in IEEE Transactions on Circuits and Systems I: Regular Papers, . . . vol. 6 6, No. 2, pp. 820-833, Feb. 2019, doi: 10.1109/TCSI.2018.2858017.

Ehsan Adabi Firouzjaei, "mm-Wave Phase Shifters and Switches", Technical Report No. UCB/EECS-2010-163, . . . http://www.eecs.berkeley.edu/Pubs/TechRpts/2010/EECS-2010-163.html, Dec. 16, 2010, pp. 116.

* cited by examiner

METHOD AND CIRCUIT FOR POWER CONSUMPTION REDUCTION IN ACTIVE PHASE SHIFTERS

PRIORITY

This application is based on and claims priority under 35 U.S.C. § 119(e) to U.S. Provisional Patent Application filed on Jun. 2, 2020 in the United States Patent and Trademark Office and assigned Ser. No. 63/033,488, the entire contents of which are incorporated herein by reference.

FIELD

The present disclosure is generally related to active phase shifters with reduced power consumption.

BACKGROUND

Directional communication at mm-wave frequencies is a key enabler for deployment of fifth generation (5G) cellular technologies. Phased arrays are used to implement these directional links.

Antennas in a phased array, when driven with specific combinations of amplitude and phase, can turn the direction of the radiated beam. One of the key blocks for realizing such a system is the phase shifter. The goal of the phase shifter is to produce a digitally programmable output phase given a fixed phase input signal while ensuring that the gain variation across these different phase states is as low as possible. Phase shifter design can be broadly classified into active and passive phase shifter design. Active phase shifters provide an area/integration and loss advantage over passive phase shifters as the number of antenna elements increase and the phase resolution becomes lower, respectively, while having a disadvantage of increased power consumption.

SUMMARY

According to one embodiment, an electronic circuit includes an in-phase (I)-quadrature (Q) amplifier including an I cascode branch and a Q cascode branch, the IQ amplifier configured to receive a differential input and control signals, control, based on the control signals, gate voltages in the I cascode branch and gate voltages in the Q cascode branch, generate an I output signal with the I cascode branch, and generate a Q output signal with the Q cascode branch, and a quadrature coupler configured to perform quadrature summation of the I output signal and the Q output signal and generate a final phase shifted output.

According to one embodiment, a method includes receiving, with an IQ amplifier including an I cascode branch and a Q cascode branch, a differential input and control signals, controlling, based on the control signals, gate voltages in the I cascode branch and gate voltages in the Q cascode branch, generating, with the I cascode branch, an I output signal, generating, with the Q cascode branch, a Q output signal, performing, with a quadrature coupler, quadrature summation of the I output signal and the Q output signal, and generating, with the quadrature coupler, a final phase shifted output.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
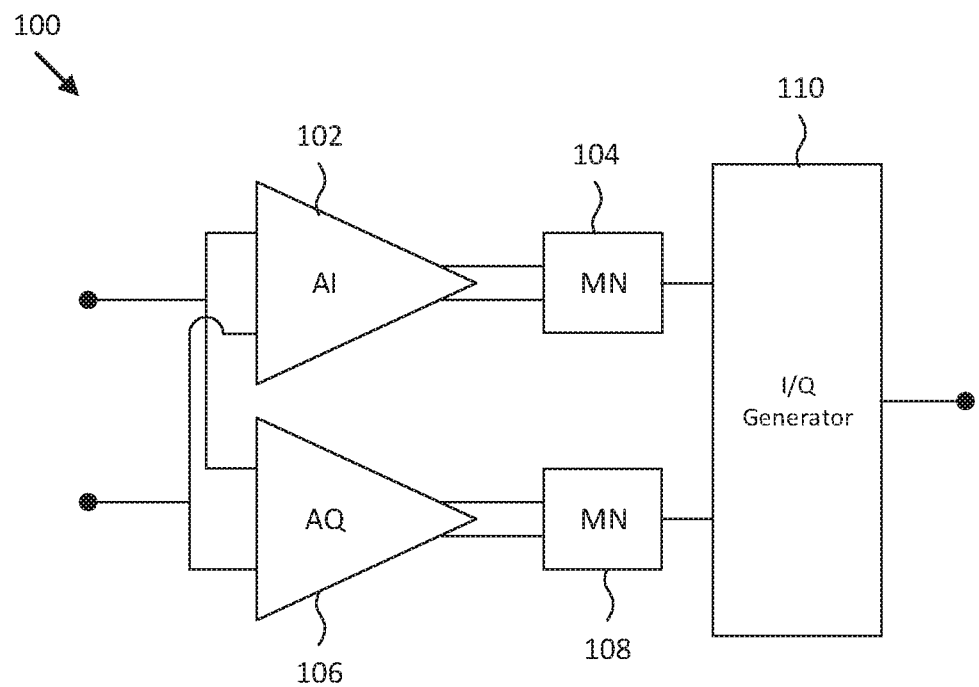
FIG. 1 illustrates a diagram of a conventional active phase shifter.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

FIG. 1 illustrates a diagram of a conventional active phase shifter 10. The active phase shifter 100 includes an in-phase (I) variable gain amplifier (VGA) "AI" 102, a corresponding impedance matching network (MN) 104, a quadrature (Q) VGA "AQ" 106, a corresponding impedance MN 108, and an I/Q generator summation circuit 110 that receives the output of the MNs 104 and 108 and performs the quadrature addition.

Based on the phase range and phase step size, different $A_I:A_Q$ ratios should be implemented to feed the I/Q generator 110 which performs quadrature vector summation. There are two requirements for the $A_I:A_Q$ ratios: (1) 'Arctan $(A_Q/A_I)$' should be close (i.e., the difference from the target phase value being lower than the phase error target) to the target phase value to be generated; and (2) '$(A_1^2 + A_Q^2)^{0.5}$' should be nearly constant (i.e., much less than the gain error target) across all the phase states. Thus, as shown in FIG. 1, the I VGA 102 and the Q VGA 106 are identical.

Figure 2:
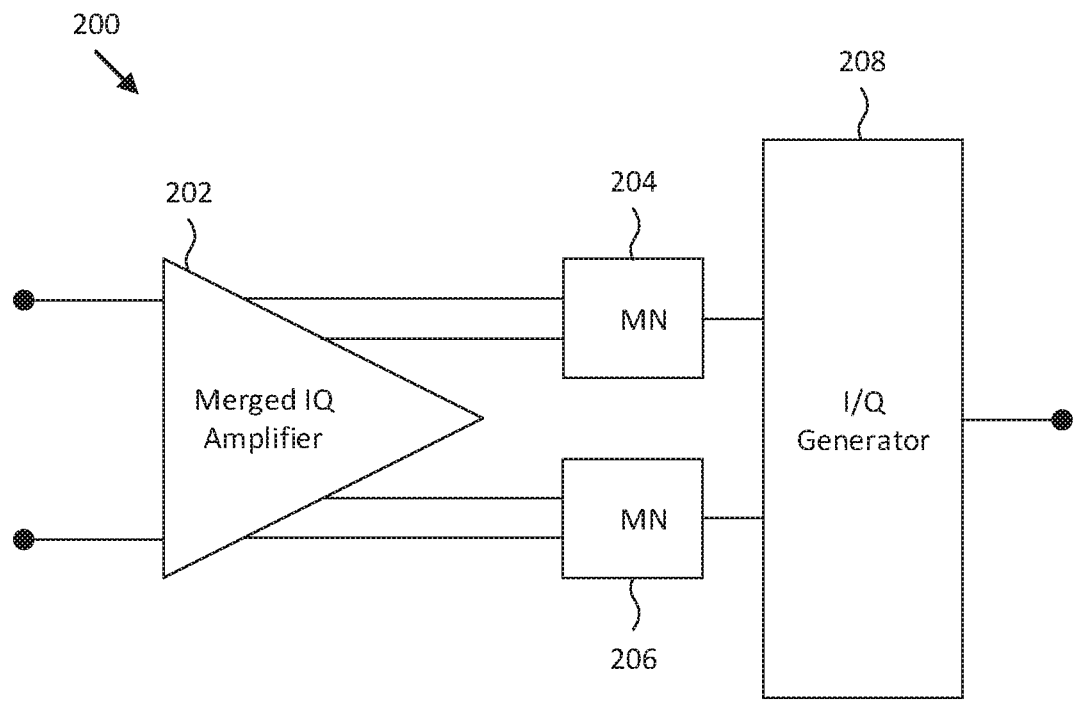
FIG. 2 illustrates a diagram of an active phase shifter, according to an embodiment.

The present system, method and circuit may be implemented in active phase shifters to reduce power consumption. FIG. 2 illustrates a diagram of an active phase shifter 200, according to an embodiment. The active phase shifter 200 includes a single, merged IQ amplifier 202, an MN 204 for an I output, an MN 206 for a Q output, and an I/Q generator summation circuit 208. The IQ amplifier 202 may include a single differential trans-conductor instead of two separate differential trans-conductors as in the conventional case in FIG. 1 to produce current that is routed to separate digitally programmable cascode branches to produce the required $A_I:A_Q$ ratios.

The active phase shifter 200 provide various advantages. The active phase shifter 200 utilizes a single differential trans-conductor to produce the signal current that is routed to separate digitally programmable cascode branches whose outputs serve as inputs to the I/Q generator summation circuit. Since conventional active phase shifters use separate amplifiers having two differential trans-conductors, this topology has a lower current consumption while producing the same output amplitude. The cascode device is segmented and then weighted in order to realize a 4-bit phase shift in the active phase shifter 200. Conventional active phase shifters are non-segmented, and only 3-bit phase shifting is achievable as a result.

The active phase shifter 200 provides reduced power consumption as compared with conventional phase shifters. The active phase shifter 200 also has reduced input gate loading/capacitance due to the use of a single differential trans-conductor compared to architectures where both I and Q paths are implemented by separate amplifiers. The reduced loading leads to higher gain/lower power consumption for the driving stage. This advantage is significant at mm-wave frequencies where the gate capacitance can have significant resistive loss due to the lossy lower level metal/poly gate routing, especially for larger width devices. The area needed for implementing the active phase shifter 200 core is at least 30% less than conventional active phase shifters, leading to a more compact layout and thus increased ease of integration.

The active phase shifter is implemented as a 4-bit 360 degree phase shifter (i.e., $360/2^4=22.5$ degree phase step). Independent of the choice of architecture for the phase shifter, the I:Q amplitude ratios required by the I/Q generator for 4-bit phase shifting are 1:0 (0 degree), 1:0.4 (22.5 degree), 0.7:0.7 (45 degree), 0.4:1 (67.5 degree) and 0:1 (90 degree).

For the most efficient use of DC current, the power consumption may be bounded by Equation (1) over all the different phase states (i.e., (I,Q) pairs where Imax and Qmax are the maximum amplitudes needed in I and Q paths across all the phase states).

$$\max(\text{abs}(I/I\text{max})+\text{abs}(Q/Q\text{max})) \qquad (1)$$

For the 4-bit phase shifting case, as shown in Table 1, if the I and Q amplitudes are summed for 0/22.5/45/67.5/90, it can be seen that Equation (1) is 1.4.

TABLE 1

| Phase Shift | Normalized AI | Normalized AQ | Arctan (AQ/AI) | $(AI^2 + AQ^2)^{0.5}$ | Normalized (AI + AQ) |
|---|---|---|---|---|---|
| 0 | 1 | 0 | 0 | 1 | 1 |
| 22.5 | 1 | 0.4 | 21.8 | 1.07 | 1.4 |
| 45 | 0.7 | 0.7 | 45 | .98 | 1.4 |
| 67.5 | 0.4 | 1 | 68.2 | 1.07 | 1.4 |
| 90 | 0 | 1 | 90 | 1 | 1 |

Thus, if the I and Q currents are generated through a single differential trans-conductor and then re-routed to two separate I/Q transformers based on the required relative ratios, then power reduction is achieved. The current consumption of the active phase shifter 200 can be limited to 1.4× compared to 2× in case of conventional design approach of using two separate amplifiers without sacrificing any gain and still generating the required phase steps.

Figure 3:
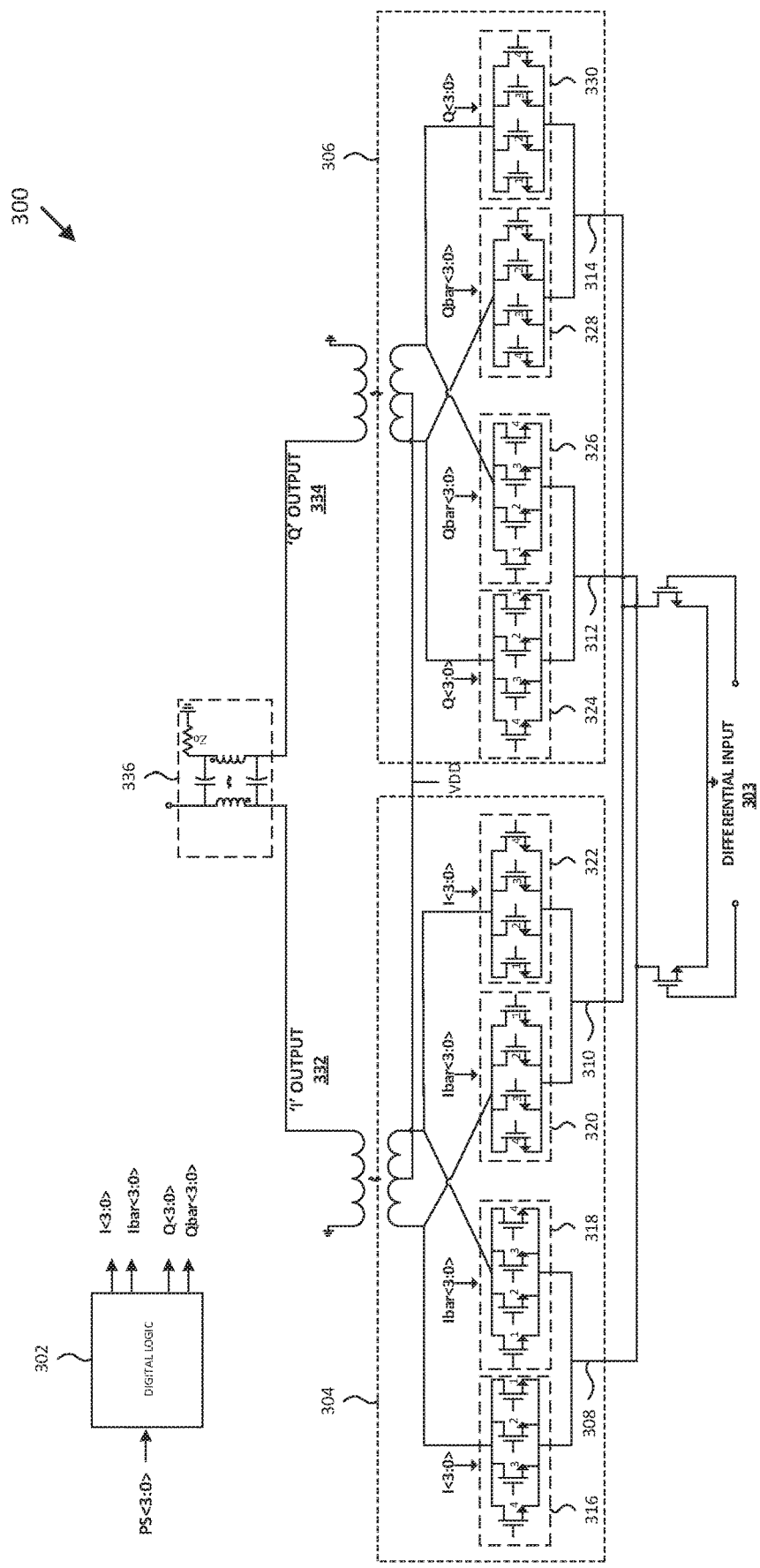
FIG. 3 illustrates a diagram of a 4-bit active phase shifter, according to an embodiment.

FIG. 3 illustrates a diagram of a 4-bit active phase shifter 300, according to an embodiment. The active phase shifter 300 includes a digital logic block 302 that produces four sets of control signals: I <3:0>, Ibar <3:0>, Q <3:0> and Qbar <3:0>. The I <3:0> and Ibar <3:0> are control signals for cascode devices in the I signal path (e.g., I-based control signals) and the Q <3:0> and Qbar <3:0> are control signals for cascode devices in the Q signal path (e.g., Q-based control signals). The active phase shifter 300 includes a single differential trans-conductor which receives the differential voltage input 303. The I cascode branch 304 produces the I signal output 332, and the Q cascode branch 306 produces the Q signal output 334. The I cascode branch 304 includes a first cascode arm 308 and a second cascode arm 310. The first cascode arm 308 includes a first segmented and weighted cascode transistor 316 and a second segmented and weighted cascode transistor 318. The second cascode arm 310 includes a third segmented and weighted cascode transistor 320 and a fourth segmented and weighted cascode transistor 322. The Q cascode branch 306 includes a first cascode arm 312 and a second cascode arm 314. The first cascode arm 312 includes a first segmented and weighted cascode transistor 324 and a second segmented and weighted cascode transistor 326. The second cascode arm 314 includes a third segmented and weighted cascode transistor 328 and a fourth segmented and weighted cascode transistor 330. Furthermore, the drain output of segmented and weighted cascode transistor 318 and segmented and weighted cascode transistor 320 are connected to the differential side of the I output balun with flipped polarity relative to 316 and 322. Likewise, the drain output of segmented and weighted cascode transistor 326 and segmented and weighted cascode transistor 328 are connected to the differential side of the Q output balun with flipped polarity relative to 324 and 330. The I cascode branch 304 produces differential output which is converted to single-ended I output 332 with a balun and the Q cascode branch 306 produces differential output which is converted to single-ended Q output 334 with a balun. The I output 332 and the Q output 334 are processed by the tuned quadrature coupler 336 which does the quadrature vector summation to produce the final phase shifted output.

As shown in FIG. 3, the active phase shifter 300 receives a differential input signal 303 and a single 4 bit digital control signal PS<3:0> which selects 1 out of the 16 possible phase shift states. The digital logic block 302 is used to produce four sets of 4 bit control signals to control the gates of the I and Q cascode transistors according to the phase shift state that is desired to be produced. The digital logic block 302 may include lookup table which contains an on/off setting for each of the cascode transistors for each of the phase states.

In each of the I/Q differential cascode arms (arms 308 and 310 of the I cascode branch 304 and arms 312 and 314 of the Q cascode branch 306), there are two sets of segmented and weighted cascode transistors controlled by I<3:0>/Q<3:0> and Ibar/Qbar<3:0>, respectively. For example, the cascode transistor 316 is controlled by I<3:0>, the cascode transistor 318 is controlled by Ibar<3:0>, the cascode transistor 320 is controlled by Ibar<3:0>, and the cascode transistor 322 is controlled by I<3:0>. Likewise, the cascode transistor 324 is controlled by Q<3:0>, the cascode transistor 326 is controlled by Qbar<3:0>, the cascode transistor 328 is controlled by Qbar<3:0>, and the cascode transistor 330 is controlled by Q<3:0> These two sets of control signals (i.e., I/Ibar and Q/Qbar) are used as there is a requirement to produce opposite polarity I/Q outputs to achieve full 360 degree phase shift capability.

Each of the cascode transistors may be segmented and weighted (4:3:2:1) in order to produce the required relative I:Q ratios. If, simultaneously, the same number of both sets of cascode devices controlled by I/Q and Ibar/Qbar are ON, then there is no net output signal as the signal current gets cancelled in the primary winding of the transformer connected at the drain of the cascode transistors. This cancelling of a portion of the signal current is used in the 0/90/180/270 degree phase states, where only the I or Q (or flipped polarity I or Q) signal is needed at the output.

Figure 4:
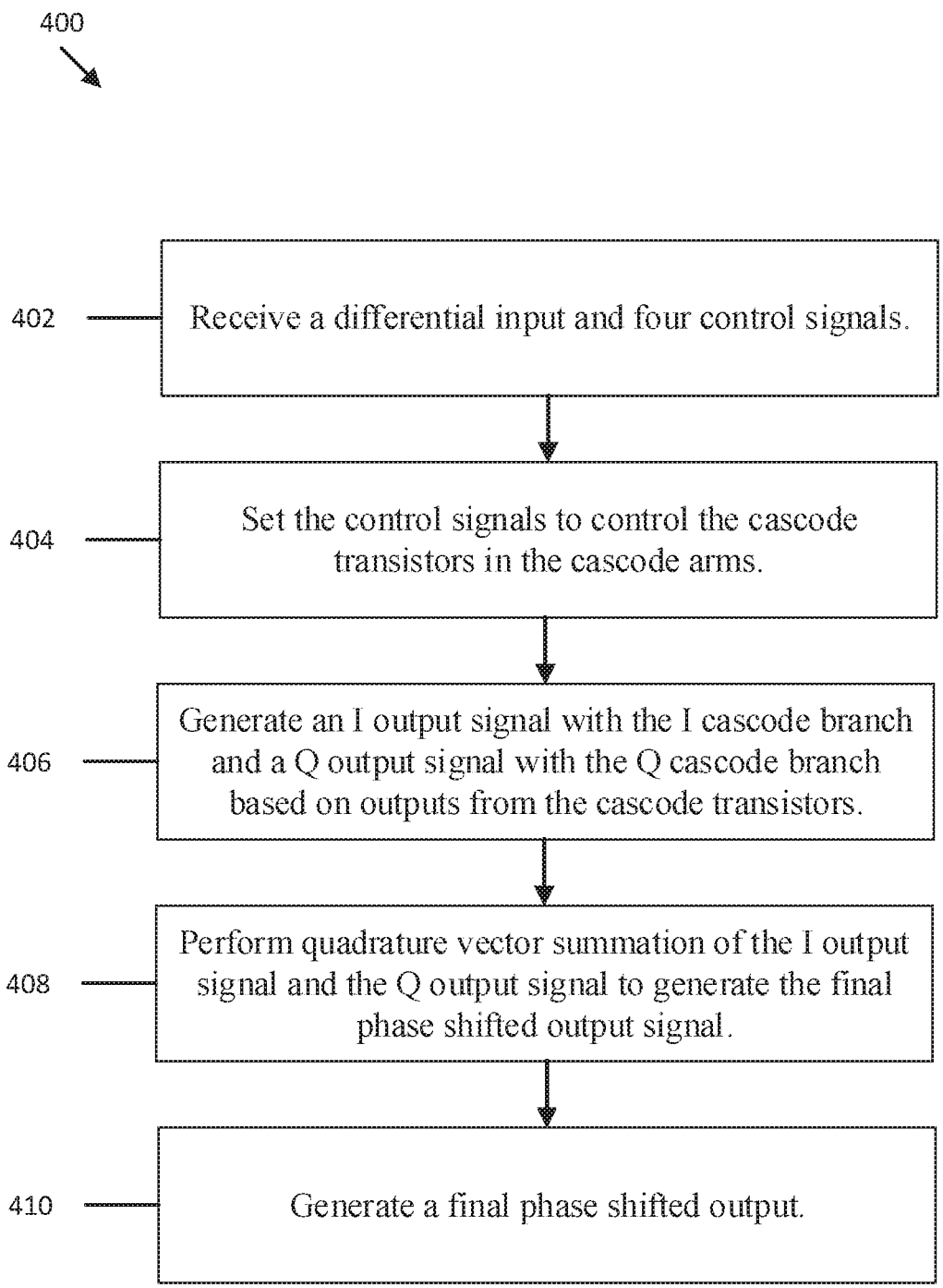
FIG. 4 illustrates a flowchart for a 4-bit active phase shifter, according to an embodiment.

FIG. 4 illustrates a flowchart 400 for a 4-bit active phase shifter, according to an embodiment. At 402, the active phase shifter receives a differential input and four control signals. The active phase shifter may receive a differential input as a differential voltage input (which is converted into current by the differential trans-conductor) as well as a 4-bit control signal. The differential voltage input maybe converted into current by a differential trans-conductor and the 4-bit control signal maybe converted into a derived set of four 4-bit control signals (e.g., by the digital block 302) I<3:0>, Ibar<3:0>, Q<3:0> and Qbar<3:0>, as described above.

At 404, the active phase shifter sets the control signals to control the cascode transistors in the cascode arms. The control signals may control the gates of the cascode transistors in the I/Q differential cascode arms. The gates are controlled according to a desired phase shift setting given by the 4-bit control input. Each of the I/Q cascode branches has two arms, each of which may include two cascode transistors which may further be segmented and weighted. In the first cascode arm of the I cascode branch, a first segmented and weighted cascode transistor's gate may be set by I<3:0> and a second segmented and weighted cascode transistor's gate may be set by Ibar<3:0>. In the second cascode arm of the I cascode branch, a third segmented and weighted cascode transistor's gate may be set by Ibar<3:0> and a fourth segmented and weighted cascode transistor's gate may be set by I<3:0>. The drain output of the second segmented and weighted cascode transistor and the drain output of the third segmented and weighted cascode transistor may be connected to the differential side of the I output balun with flipped polarity relative to the drain outputs of the first and fourth segmented and weighted cascode transistor. In the first cascode arm of the Q cascode branch, a first segmented and weighted cascode transistor's gate may be set by Q<3:0> and a second segmented and weighted cascode transistor's gate may be set by Qbar<3:0>. In the second cascode arm of the Q cascode branch, a third segmented and weighted cascode transistor's gate may be set by Qbar<3:0> and a fourth segmented and weighted cascode transistor's gate may be set by Q<3:0>. The drain output of the second segmented and weighted cascode transistor and the drain output of the third segmented and weighted cascode transistor may be connected to the differential side of the Q output balun with flipped polarity relative to the drain outputs of the first and fourth segmented and weighted cascode transistor.

At 406, the active phase shifter generates an I output signal with the I cascode branch and a Q output signal with the Q cascode branch based on the outputs from the cascode transistors. At 408, the active phase shifter performs quadrature vector summation (with a I/Q generator/summation circuit) of the I output signal and the Q output signal to generate the final desired phase shifted output signal. At 410, the active phase shifter, with a quadrature coupler, generates a final phase shifted output.

As an additional or alternative embodiment, given the phase shifter step size, different relative weightings of the cascode transistors are possible, leading to slightly different systematic phase errors across phase states.

Another additional or alternative embodiment includes a different segmenting and weighting for the cascode transistors based on different target I:Q weighting ratios needed for realizing a higher or lower phase shift step size. The concept of using a single merged I/Q amplifier core is possible but the power saving advantage may be different from that of the 4-bit active phase shifter.

Figure 5:
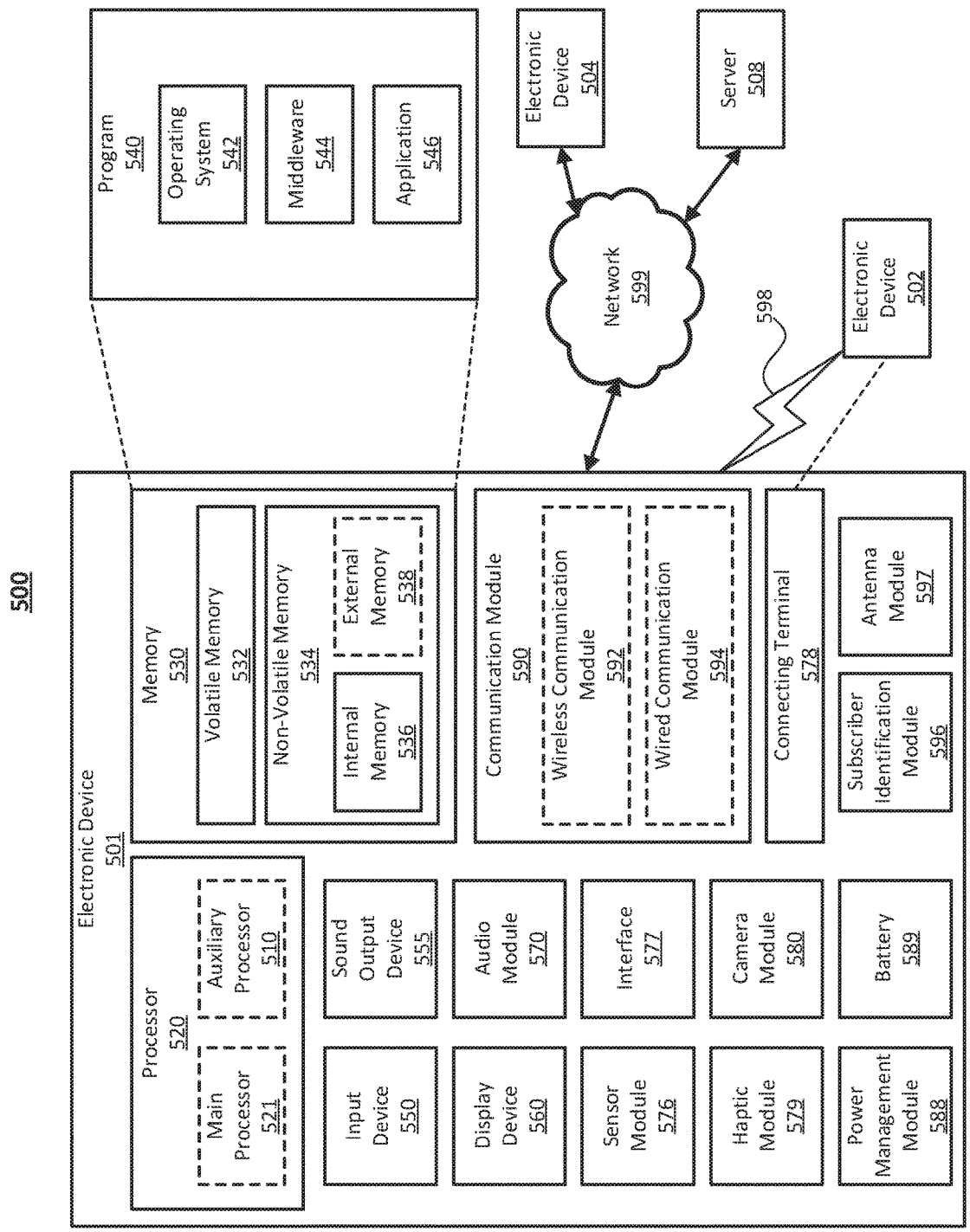
FIG. 5 illustrates a block diagram of an electronic device in a network environment, according to one embodiment.

FIG. 5 illustrates a block diagram of an electronic device 501 in a network environment 500, according to one embodiment. Referring to FIG. 5, the electronic device 501 in the network environment 500 may communicate with another electronic device 502 via a first network 598 (e.g., a short-range wireless communication network), or another electronic device 504 or a server 508 via a second network 599 (e.g., a long-range wireless communication network). The electronic device 501 may also communicate with the electronic device 504 via the server 508. The electronic device 501 may include a processor 520, a memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (SIM) 596, or an antenna module 597. In one embodiment, at least one (e.g., the display device 560 or the camera module 580) of the components may be omitted from the electronic device 501, or one or more other components may be added to the electronic device 501. In one embodiment, some of the components may be implemented as a single integrated circuit (IC). For example, the sensor module 576 (e.g., a fingerprint sensor, an iris sensor, or an illuminance sensor) may be embedded in the display device 560 (e.g., a display).

The processor 520 may execute, for example, software (e.g., a program 540) to control at least one other component (e.g., a hardware or a software component) of the electronic device 501 coupled with the processor 520, and may perform various data processing or computations. As at least part of the data processing or computations, the processor 520 may load a command or data received from another component (e.g., the sensor module 576 or the communication module 590) in volatile memory 532, process the command or the data stored in the volatile memory 532, and store resulting data in non-volatile memory 534. The processor 520 may include a main processor 521 (e.g., a central processing unit (CPU) or an application processor (AP)), and an auxiliary processor 523 (e.g., a graphics processing unit (GPU), an image signal processor (ISP), a sensor hub processor, or a communication processor (CP)) that is operable independently from, or in conjunction with, the main processor 521. Additionally or alternatively, the auxiliary processor 523 may be adapted to consume less power than the main processor 521, or execute a particular function. The auxiliary processor 523 may be implemented as being separate from, or a part of, the main processor 521.

The auxiliary processor 523 may control at least some of the functions or states related to at least one component (e.g., the display device 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to one embodiment, the auxiliary processor 523 (e.g., an ISP or a CP) may be implemented as part of another component (e.g., the camera module 580 or the communication module 590) functionally related to the auxiliary processor 523.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input device 550 may receive a command or data to be used by other component (e.g., the processor 520) of the electronic device 501, from the outside (e.g., a user) of the electronic device 501. The input device 550 may include, for example, a microphone, a mouse, or a keyboard.

The sound output device 555 may output sound signals to the outside of the electronic device 501. The sound output device 555 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 560 may visually provide information to the outside (e.g., a user) of the electronic device 501. The display device 560 may include, for example, a display, a hologram device, or a projector and control circuitry to control a corresponding one of the display, hologram device, and projector. According to one embodiment, the display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. According to one embodiment, the audio module 570 may obtain the sound via the input device 550, or output the sound via the sound output device 555 or a headphone of an external electronic device 502 directly (e.g., wired) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. The sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device 502 directly (e.g., wired) or wirelessly. According to one embodiment, the interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device 502. According to one embodiment, the connecting terminal 578 may include, for example, an HDMI connector, a USB connector, an SD card connector, or an audio connector (e.g., a headphone connector).

The haptic module 579 may convert an electrical signal into a mechanical stimulus (e.g., a vibration or a movement) or an electrical stimulus which may be recognized by a user via tactile sensation or kinesthetic sensation. According to one embodiment, the haptic module 579 may include, for example, a motor, a piezoelectric element, or an electrical stimulator.

The camera module 580 may capture a still image or moving images. According to one embodiment, the camera module 580 may include one or more lenses, image sensors, ISPs, or flashes.

The power management module 588 may manage power supplied to the electronic device 501. The power management module 588 may be implemented as at least part of, for example, a power management integrated circuit (PMIC).

The battery 589 may supply power to at least one component of the electronic device 501. According to one embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more CPs that are operable independently from the processor 520 (e.g., the AP) and supports a direct (e.g., wired) communication or a wireless communication. According to one embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or a standard of the Infrared Data Association (IrDA)) or the second network 599 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The antenna module 597 may transmit or receive a signal or power to or from the outside (e.g., the external electronic device) of the electronic device 501. According to one embodiment, the antenna module 597 may include one or more antennas, and, therefrom, at least one antenna appropriate for a communication scheme used in the communication network, such as the first network 598 or the second network 599, may be selected, for example, by the communication module 590 (e.g., the wireless communication module 592). The signal or the power may then be transmitted or received between the communication module 590 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 501 and the external electronic device 504 via the server 508 coupled with the second network 599. Each of the electronic devices 502 and 504 may be a device of a same type as, or a different type, from the electronic device 501. All or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, or client-server computing technology may be used, for example.

One embodiment may be implemented as software (e.g., the program 540) including one or more instructions that are stored in a storage medium (e.g., internal memory 536 or external memory 538) that is readable by a machine (e.g., the electronic device 501). For example, a processor of the electronic device 501 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An electronic circuit, comprising:
   a digital logic block configured to generate control signals based on a 4-bit digital input;
   an in-phase (I)-quadrature (Q) amplifier including an I cascode branch and a Q cascode branch, the IQ amplifier configured to:
   receive a differential input and the control signals;
   control, based on the control signals, gate voltages in the I cascode branch and gate voltages in the Q cascode branch;
   generate an I output signal with the I cascode branch; and
   generate a Q output signal with the Q cascode branch; and
   a quadrature coupler configured to:
   perform quadrature summation of the I output signal and the Q output signal; and
   generate a final phase shifted output.

2. The electronic circuit of claim 1, wherein the I cascode branch includes a first cascode arm and a second cascode arm.

3. The electronic circuit of claim 2, wherein the first cascode arm includes a first cascode transistor and a second cascode transistor, and the second cascode arm includes a third cascode transistor and a fourth cascode transistor.

4. The electronic circuit of claim 3, wherein the first, second, third and fourth cascode transistors process I-based control signals of the received control signals.

5. The electronic circuit of claim 3, wherein the first, second, third and fourth cascode transistors are segmented and weighted to produce relative I:Q ratios.

6. The electronic circuit of claim 1, wherein the Q cascode branch includes a first cascode arm and a second cascode arm.

7. The electronic circuit of claim 6, wherein the first cascode arm includes a first cascode transistor and a second cascode transistor, and the second cascode arm includes a third cascode transistor and a fourth cascode transistor.

8. The electronic circuit of claim 7, wherein the first, second, third and fourth cascode transistors process Q-based control signals of the received control signals.

9. The electronic circuit of claim 6, wherein the first, second, third and fourth cascode transistors are segmented and weighted to produce relative I:Q ratios.

10. A method, comprising:
    generating, with a digital logic block, control signals based on a 4-bit digital input;
    receiving, with an in-phase (I)-quadrature (Q) amplifier including an I cascode branch and a Q cascode branch, a differential input and the control signals;
    controlling, based on the control signals, gate voltages in the I cascode branch and gate voltages in the Q cascode branch;
    generating, with the I cascode branch, an I output signal;
    generating, with the Q cascode branch, a Q output signal;
    performing, with a quadrature coupler, quadrature summation of the I output signal and the Q output signal; and
    generating, with the quadrature coupler, a final phase shifted output.

11. The method of claim 10, wherein the I cascode branch includes a first cascode arm and a second cascode arm.

12. The method of claim 11, wherein the first cascode arm includes a first cascode transistor and a second cascode transistor, and the second cascode arm includes a third cascode transistor and a fourth cascode transistor.

13. The method of claim 12, wherein processing the control signals further comprises processing, with the first, second, third and fourth cascode transistors, I-based control signals of the received control signals.

14. The method of claim 12, wherein the first, second, third and fourth cascode transistors are segmented and weighted to produce relative I:Q ratios.

15. The method of claim 10, wherein the Q cascode branch includes a first cascode arm and a second cascode arm.

16. The method of claim 15, wherein the first cascode arm includes a first cascode transistor and a second cascode transistor, and the second cascode arm includes a third cascode transistor and a fourth cascode transistor.

17. The method of claim 16, wherein processing the control signals further comprises processing, with the first, second, third and fourth cascode transistors, Q-based control signals of the received control signals.

18. The method of claim 15, wherein the first, second, third and fourth cascode transistors are segmented and weighted to produce relative I:Q ratios.

19. An electronic circuit, comprising:
    an in-phase (I)-quadrature (Q) amplifier including an I cascode branch and a Q cascode branch, the IQ amplifier configured to:
    receive a differential input and control signals;
    control, based on the control signals, gate voltages in the I cascode branch and gate voltages in the Q cascode branch;
    generate an I output signal with the I cascode branch; and generate a Q output signal with the Q cascode branch; and a quadrature coupler configured to:
  perform quadrature summation of the I output signal and the Q output signal; and
  generate a final phase shifted output, wherein the I cascode branch or the Q cascode branch includes a first cascode arm and a second cascode arm.

20. A method, comprising:

receiving, with an in-phase (I)-quadrature (Q) amplifier including an I cascode branch and a Q cascode branch, a differential input and control signals;

controlling, based on the control signals, gate voltages in the I cascode branch and gate voltages in the Q cascode branch;

generating, with the I cascode branch, an I output signal;

generating, with the Q cascode branch, a Q output signal;

performing, with a quadrature coupler, quadrature summation of the I output signal and the Q output signal; and generating, with the quadrature coupler, a final phase shifted output, wherein the I cascode branch or the Q cascode branch includes a first cascode arm and a second cascode arm.

* * * * *